(12) United States Patent
Nakanishi

(10) Patent No.: US 7,474,024 B2
(45) Date of Patent: Jan. 6, 2009

(54) ELECTRONIC CONTROL UNIT AND ELECTRIC PUMP

(75) Inventor: Shingo Nakanishi, Obu (JP)

(73) Assignee: Aisan Kogyo Kabushiki Kaisha, Obu-shi, Aichi-ken (JP)

( * ) Notice: Subject to any disclaimer, the term of this patent is extended or adjusted under 35 U.S.C. 154(b) by 590 days.

(21) Appl. No.: 11/224,104

(22) Filed: Sep. 13, 2005

(65) Prior Publication Data

US 2006/0057002 A1    Mar. 16, 2006

(30) Foreign Application Priority Data

Sep. 15, 2004   (JP)   ............. 2004-268744
Sep. 16, 2004   (JP)   ............. 2004-269231

(51) Int. Cl.
*H02K 11/00* (2006.01)
(52) U.S. Cl. .............. 310/71; 310/64; 310/89
(58) Field of Classification Search ............ 310/71, 310/64, 89, 68 R; 417/423.7
See application file for complete search history.

(56) References Cited

U.S. PATENT DOCUMENTS

| | | | | |
|---|---|---|---|---|
| 4,998,865 | A | * | 3/1991 | Nakanishi et al. ......... 417/423.7 |
| 5,783,881 | A | * | 7/1998 | Best et al. ................ 310/68 C |
| 6,065,946 | A | * | 5/2000 | Lathrop ................ 417/423.14 |
| 6,191,506 | B1 | * | 2/2001 | Wright ...................... 29/598 |
| 6,225,716 | B1 | * | 5/2001 | Sies et al. ................ 310/68 B |
| 6,271,609 | B1 | * | 8/2001 | Hollenbeck et al. ........... 310/71 |
| 6,278,207 | B1 | * | 8/2001 | Matsumoto ................... 310/88 |
| 6,394,767 | B1 | * | 5/2002 | Matsumoto .............. 417/423.1 |
| 6,524,083 | B2 | * | 2/2003 | Deai et al. .................. 417/370 |
| 6,538,350 | B2 | * | 3/2003 | Martin ....................... 310/43 |
| 6,704,202 | B1 | * | 3/2004 | Hamaoka et al. ............ 361/704 |
| 7,411,324 | B2 | * | 8/2008 | Kusumi .................... 310/68 D |
| 2001/0033800 | A1 | | 10/2001 | Deai et al. |

FOREIGN PATENT DOCUMENTS

| | | |
|---|---|---|
| JP | 6-260777 | 9/1994 |
| JP | 10-311290 | 11/1998 |
| JP | 11-166500 | 6/1999 |
| JP | 11-234964 | 8/1999 |
| JP | 2002-141676 | 5/2002 |
| JP | 2002-357192 | 12/2002 |
| JP | 2003-152368 | 5/2003 |
| JP | 2004-183595 | 7/2004 |

* cited by examiner

*Primary Examiner*—Thanh Lam
(74) *Attorney, Agent, or Firm*—Dennison, Schultz & MacDonald

(57) ABSTRACT

An electronic control unit 10 may comprise a case 12, a board 23 accommodated inside the case 12, and electronic components (25, 29, 31) mounted on the board 23. An opening 13 may be formed on one face of the case 12 opposite one of the faces of the board 23. The case 12 may be filled with potting material 41, and the board 23 and the electronic components (25, 29, 31) may be embedded in the potting material 41. The distance between the electrodes of the respective electronic components (25, 29) mounted on the non-opening side face of the board 23 may be greater than that of any of the electronic components 31 mounted on the opening-side face of the board 23.

17 Claims, 6 Drawing Sheets

ELECTRONIC CONTROL UNIT AND ELECTRIC PUMP

CROSS REFERENCE

This application claims priority to Japanese patent application number 2004-268744, filed Sep. 15, 2004, and Japanese patent application number 2004-269231, filed Sep. 16, 2004, each of which are incorporated herein by reference as if fully set forth herein.

BACKGROUND OF THE INVENTION

1. Field of the Invention

The present invention relates to an electronic control unit for use in an electrically powered appliance (such as an electric pump, for example), and more particularly to an electronic control unit having a board on which electronic components are mounted.

2. Description of the Related Art

Japanese Laid-open Patent Publication No. 6-260777 discloses an electronic control unit for controlling an electrically powered appliance. This electronic control unit comprises a board mounted with electronic components and a case that accommodates the board. The case is filled with potting material, and the board and the electronic components are embedded in this potting material. By enclosing the periphery of the electronic components in potting material, this electronic control unit improves heat radiation away from the electronic components and prevents deterioration of the electronic components due to the external environment (such as moisture).

In this type of electronic control unit, the case is filled with potting material. Normally, the case is filled with potting material by pouring liquid-type (liquid-state) potting material into the case and allowing it to harden. With this method, though, bubbles can become trapped in the potting material during pouring. This can cause the electronic components to short or malfunction when the moisture contained in the bubbles condenses. For this reason, measures are taken to remove bubbles from the potting material after it has been poured into the case (by placing the electronic control unit in a vacuum chamber before the potting material hardens, for example). An opening is also provided in the case to allow air removed from the potting material during this process to be discharged outside the case.

SUMMARY OF THE INVENTION

In some cases, however, relatively small electronic components need to be mounted on the board. It is easy for bubbles to become trapped in the periphery of small electronic components when the potting material is poured, and large numbers of air bubbles can get mixed in with the potting material. Furthermore, the opening for discharging air from the case is formed on one face of the case opposite one of the faces of the board. Consequently, any bubbles trapped in the potting material on the side of the board away from the opening must travel round the board before escaping through the opening. These factors made it difficult to remove bubbles from the potting material in a short period of time.

Accordingly, it is one object of the present teachings to provide an electronic control unit, in which a case accommodating a board is filled with potting material, that makes it possible to remove bubbles from the potting material in a short period of time.

In one aspect of the present teachings, an electronic control unit may comprise a case, a board disposed within the case, and electronic components mounted on the board. The case may have an opening in one face thereof opposite one of the faces of the board. The case may be filled with potting material, and the board and the electronic components may be embedded in the potting material. The distance between the electrodes of the respective electronic components mounted on the non-opening side face of the board may be greater than that of any of the components mounted on the opening-side face of the board. In other words, electronic components having a large distance between electrodes may be mounted on the non-opening side face of the board, and electronic components with a smaller distance between electrodes may be mounted on the opening-side face of the board. This structure ensures that 'large electronic components' that do not trap bubbles easily are mounted on the 'non-opening side' from which it is more difficult for bubbles to escape, while 'small electronic components' more likely to trap bubbles are mounted on the 'opening side' from which bubbles can escape more easily. Because of this, fewer bubbles are trapped on the 'non-opening side' from which air bubbles do not escape easily, allowing bubbles to be removed from the potting material in a shorter period of time.

Preferably, the distance between the electrodes of the electronic components mounted on the non-opening side face of the board may be greater than or equal to 2.0 mm. This allows bubbles to be removed from the potting material in a short period of time, and reduces the occurrence of shorting between the electrodes and other faults in the electronic components.

Optionally, the board may have a penetrating hole that passes through from the opening-side face to the non-opening side face of the board. This allows bubbles trapped in the potting material on the non-opening side face to pass through the penetrating hole and escape to the opening-side face of the board.

Further, a space may also be formed between the inner face of the case and the board. This allows any bubbles in the potting material on the non-opening side to escape through the space between the board and the inner face of the case to the side with the opening.

These features may be utilized singularly or, in combination, in order to make improved electronic control units. In addition, other objects, features and advantages of the present teachings will be readily understood after reading the following detailed description together with the accompanying drawings and claims. Of course, the additional features and aspects disclosed herein also may be utilized singularly or, in combination with the above-described features.

A BRIEF DESCRIPTION OF THE DRAWINGS

DESCRIPTION OF THE PREFERRED EMBODIMENTS

Figure 1:
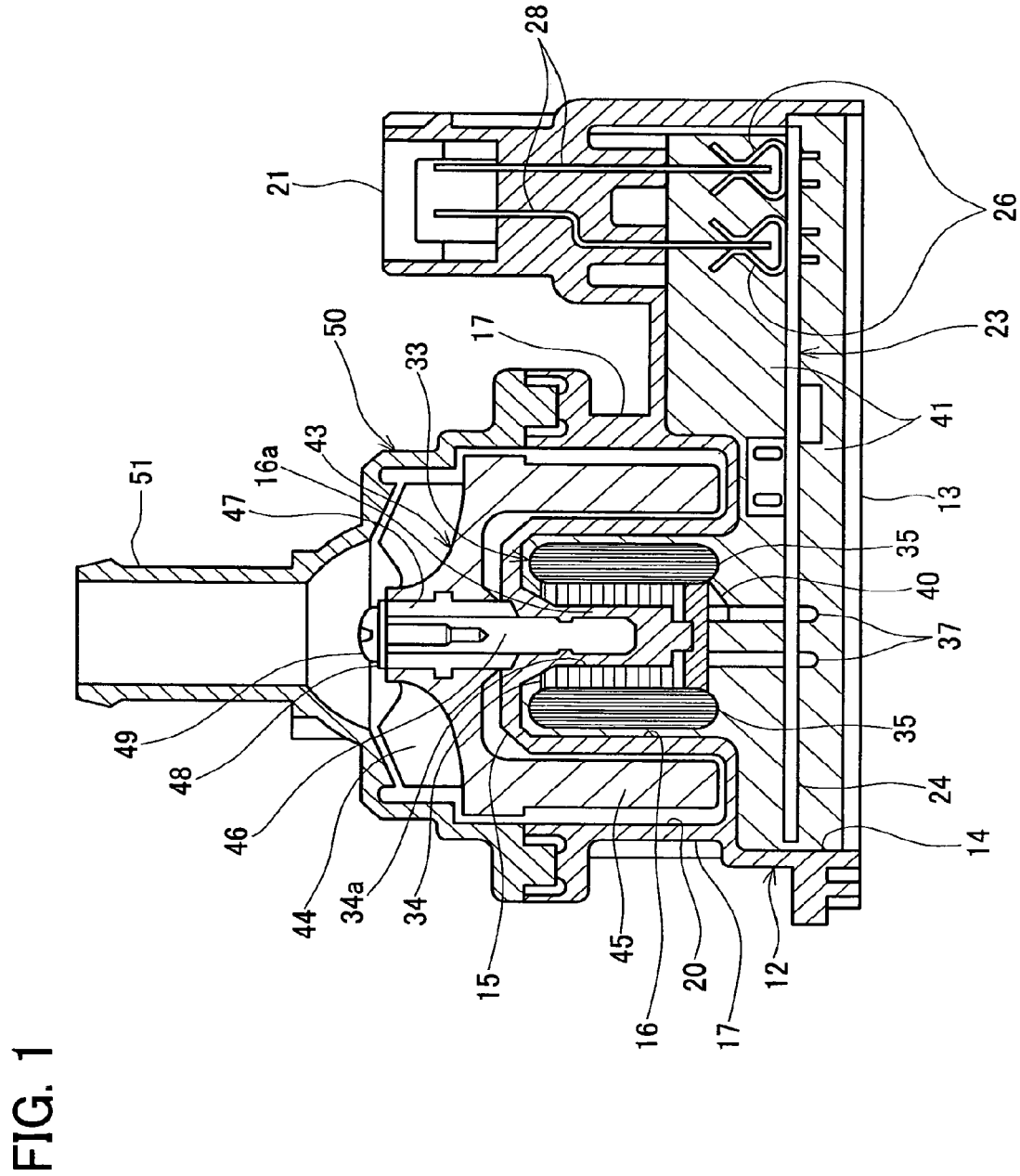
FIG. 1 is a longitudinal cross-section of the electric pump according to a first detailed representative embodiment.

In one embodiment of the present teachings, an electric pump may comprise an electronic control unit, a stator coil controlled by the electronic control unit, and a rotor driven by the stator coil. The electronic control unit may comprise a first case, a board disposed within the first case, and electronic components mounted on the board. The stator coil may be accommodated inside the first case and electrically connected to the board. A second case may be provided adjacent to the first case, and the pump chamber may be formed by the first and second cases. The rotor may be rotatably disposed within the pump chamber. The rotor may be disposed on the inside or the outside of the stator coil. When current flows from the electronic control unit to power the stator coil, the rotor is rotated by means of a magnetic force produced by the stator coil. An impeller may be provided on the rotor. When the rotor rotates, fluid (such as fuel or water) is sucked into the pump chamber, pressurized, and then discharged from the pump chamber.

An opening may be formed on one face of the first case opposite one of the faces of the board. The first case may be filled with potting material and the board and electronic components may be embedded in the potting material. Further, the distance between the electrodes of the electronic components mounted on the non-opening side face of the board may be greater than that of any of the electronic components mounted on the opening-side face. Furthermore, the distance between electrodes of the electronic components mounted on the non-opening side face of the board may preferably be at least 2.0 mm.

In this electric pump, the stator coil generates heat when it is electrically powered. If the heat generated by the stator coil is conducted to the electronic components on the board, these components can reach undesirably high temperatures. Thus, no electronic components preferably may be mounted within an area formed by projecting the stator coil onto the board from infinity on the non-board side of the stator coil (i.e., the stator coil projection area). This is because the stator coil projection area is heated to high temperatures by the stator coil. By not mounting electronic components inside the stator coil projection area, it is possible to prevent the electronic components from reaching high temperatures.

Further, a slit may be formed in the board, dividing the mounting surface of the board into a terminal-side area and a non-terminal side area. Preferably, no electronic components may be mounted inside the terminal-side area, and electronic components may be mounted in the non-terminal side area. Heat is conducted via terminals from the stator coil to the board. Forming a slit on the board makes it possible to reduce the amount of heat conducted from the terminal-side area of the board to the non-terminal side area. Mounting the electronic components on the non-terminal side area prevents the electronic components from reaching high temperatures.

For example, the slit may be formed within the stator coil projection area, further from the center of the projection area than the terminals. In this case, the electronic components are preferably mounted outside the slit. It is also possible to fill the slit with potting material. In this case, it is preferable that the thermal conductivity of the potting material is lower than that of the board. This makes it possible to reduce the amount of heat conducted across the slit.

Furthermore, electronic components generating large amounts of heat (that is to say, those electronic components mounted on the board that generate relatively large amounts of heat) may be mounted in an area of the board opposite the accommodation portion of the rotor within the pump chamber. This area of the board is effectively cooled by the fluid flowing through the pump chamber. Thus, mounting electronic components generating large amounts of heat in this area prevents the electronic components from reaching high temperatures.

Each of the additional features disclosed above and below may be utilized separately or in conjunction with other features to provide improved electronic control units and electric pumps for making and using the same. Detailed representative examples of the present teachings, which examples will be described below, utilize many of these additional features in conjunction. However, this detailed description is merely intended to teach a person of skill in the art further details for practicing preferred aspects of the present teachings and is not intended to limit the scope of the invention. Only the claims define the scope of the claimed invention. Therefore, combinations of features disclosed in the following detailed description may not be necessary to practice the present teachings in the broadest sense, and are instead taught merely to particularly describe representative and preferred embodiments of the present teachings, which will be explained below in further detail with reference to the figures. Of course, features described in this specification and in the dependent claims may be combined in ways that are not specifically enumerated in order to obtain other usual and novel embodiments of the present teachings and the present inventors contemplate such additional combinations.

First Detailed Representative Embodiment

Electric pump 10 according to a first detailed representative embodiment of the present teachings will be explained. Electric pump 10 may be used in a motor vehicle, electric pump 10 being utilized within a fuel tank and being utilized for supplying fuel to an engine of the motor vehicle.

FIG. 1 is a longitudinal cross-section of electric pump 10. Electric pump 10 may comprise housing 12 and a body 50 fixed by housing 12. Both housing 12 and body 50 may be molded from resin material (e.g., plastic or similar material). A raised protuberance 15 may be formed on one side of the top of housing 12 (in FIG. 1, the left side). The cross-section of the raised protuberance 15 is circular. A shaft holder 16a is provided in the center of the raised protuberance 15. The bottom of a shaft 46 is fixed to the shaft holder 16a. The top end of the shaft 46 protrudes upwards from the top of the raised protuberance 15. Rotor 43 is rotatably attached to the top of the shaft 46.

A connector 21 may be provided on the other side of the top of housing 12 (in FIG. 1, the right side). Electric wiring 28 is disposed inside the connector 21. The bottom of the electric wiring 28 is connected to terminals 26 on the circuit board 23, and the top of the connector 21 is connected to an external power source (not shown in the diagram). Electricity from the external power source is supplied to the circuit board 23 via the electric wiring 28 and the terminals 26.

An outer wall 17 is formed around the sidewall of the raised protuberance 15. The sidewall of the raised protuberance 15 and the outer wall 17 are disposed concentrically. A second indentation (i.e., rotor-accommodating part) 20, the top of which is left open, is formed by the raised protuberance 15 and the outer wall 17. The magnet 45 of rotor 43 is accommodated inside the second indentation 20.

The bottom of body 50 is fixed (for example, welded) to the outer wall 17 of housing 12. Body 50 is formed with a suction port 51 and a discharge port (not shown). The internal space formed by housing 12 and body 50 (in other words, the internal space formed by the outer wall 17, the raised protuberance 15, and body 50) functions as the pump chamber.

Rotor 43 is disposed inside the pump chamber. Rotor 43 is made of resin material (e.g., plastic), and comprises a substantially cylindrical magnet portion 45 and an impeller 44. The magnet portion 45 may contain magnetic powder. An axle-receiving part 47 is fixed to the impeller 44. The axle-receiving part 47 may be formed from resin material (e.g., polyphenylene sulfide (PPS)). The shaft 46 is inserted into a hole in the axle-receiving part 47. Rotor 43 is free to rotate around the shaft 46. A washer 48 is fitted to the top of the shaft 46 with a screw 49. This prevents rotor 43 from rising during rotation.

When rotor 43 is driven and rotated by the stator coil 35, fluid is sucked into the pump chamber through the suction port 51. The sucked-in fluid is pressurized by the rotation of rotor 43, and discharged through the discharge port. Sucked-in fluid also enters the second indentation 20 of housing 12. Fluid entering the second indentation 20 is churned by the rotating rotor 43 and frequently replaced.

A first indentation (i.e., board-accommodating part) 14 is formed inside housing 12. A third indentation (i.e., stator-accommodating part) 16 is formed inside the raised protuberance 15. The bottom of the third indentation 16 communicates with the first indentation 14. Together the first indentation 14 and the third indentation 16 form an accommodation space within which the circuit board 23 is accommodated. The bottom of the first indentation 14 is left open, and the circuit board 23 is inserted from the bottom of the first indentation 14 into the first indentation 14 and the third indentation 16. The first indentation 14 and the third indentation 16 are filled with potting material 41. The circuit board 23 is embedded in the potting material 41. The potting material 41 prevents external fluid from entering the first indentation 14 and the third indentation 16, and prevents malfunction and damage to the circuit board 23.

For the potting material 41, it is preferable to use material having high thermal conductivity. This ensures that heat is radiated away from the stator 33 and other components, preventing the circuit board 23 from reaching high temperatures. Resin materials such as heat-dissipating silicon, synthetic resins, and epoxy resins may be used for the potting material 41. Alumina fiber (or filler) may also be mixed with these resin materials. Adding the alumina fiber further improves thermal conductivity.

As shown in FIG. 1, the circuit board 23 may comprise a board 24 and a stator 33 fixed to the board 24. The stator 33 may comprise a stator core 34 and a stator coil 35. The stator core 34 may be made by laminating a thin steel sheet (such as silicon steel plate, for example), obtained by press working.

Figure 2:
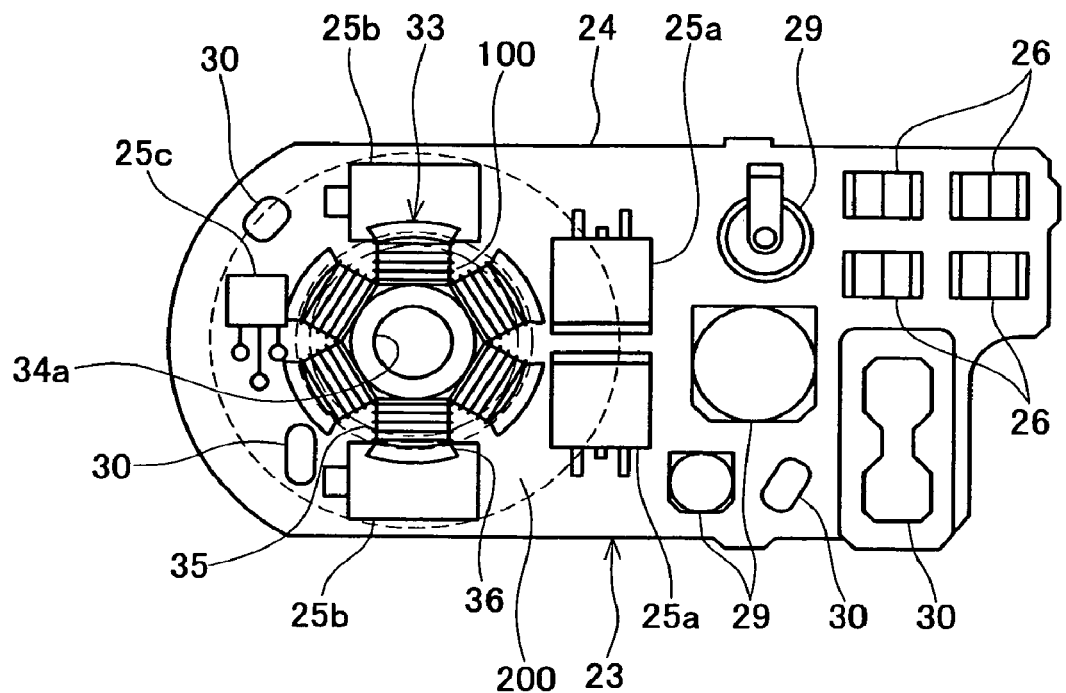
FIG. 2 is a plan view of the upper face of the circuit board according to the first detailed representative embodiment.

As shown in FIG. 2, a plurality of slots 36 may be formed on the stator core 34. A fitment hole 34a may be formed in the center of the stator core 34. With the stator 33 accommodated inside the third indentation 16, the shaft holder 16a is fitted into the fitment hole 34a (see FIG. 1). This fixes the stator 33 in specified position within the third indentation 16.

The tops of the terminals 37 are fixed to the bottom of the stator core 34. The bottoms of the terminals 37 are soldered to terminal lands 27 on the board 24 (See FIGS. 3 and 4). The stator 33 is thus fixed to the board 24 via the terminal lands 27.

The stator coil 35 is wound round the slots 36 in the stator core 34. One end 40 of the stator coil 35 is connected to the terminals 37.

Figure 4:
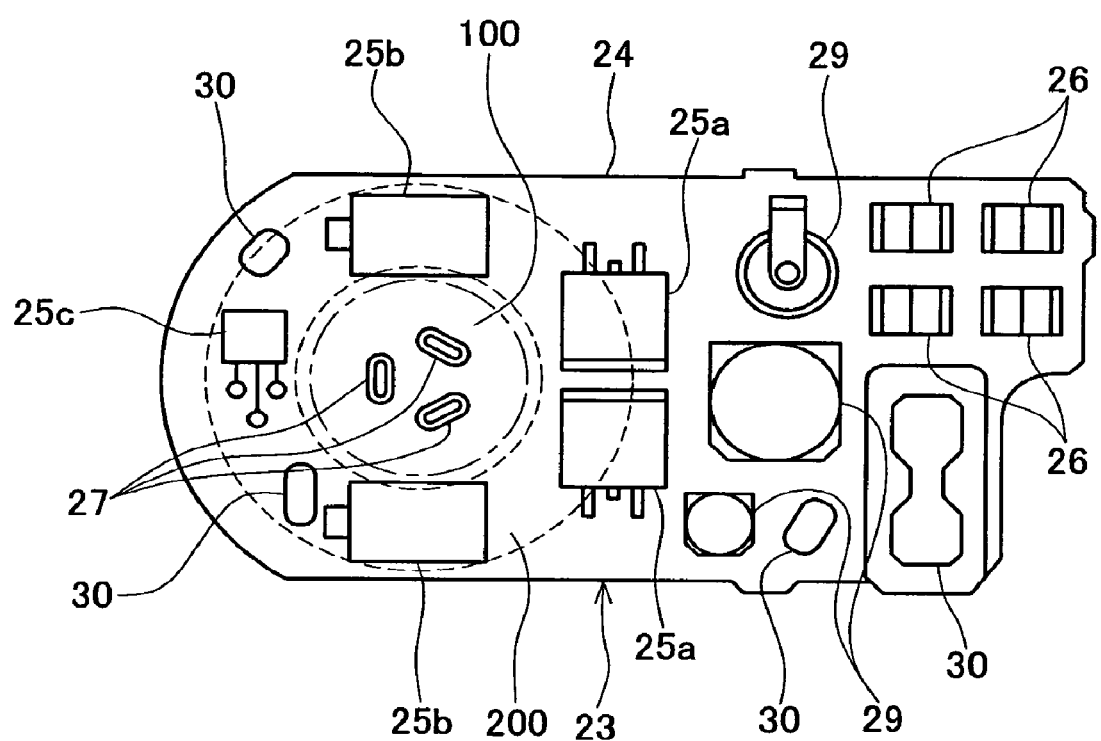
FIG. 4 is a plan view of the upper face of the circuit board according to the first detailed representative embodiment (stator not shown).

As shown in FIG. 2 and FIG. 4, electronic components 25 (25a, 25b, 25c) and 29, as well as the stator 33, are mounted on the stator-side face of the board 24 (referred to below as the upper face). Printed wiring (not shown) is also arranged on the upper face of the board 24.

A hall element 25c and electronic components generating large amounts of heat such as a power transistor 25a and a power diode 25b, are preferably disposed in an area 200 of the upper face of the board 24 opposite the bottom face of the magnet 45 of rotor 43 (i.e. the donut-shaped area enclosed by two broken lines in the diagram, an area opposite the second indentation 20 in housing 12). The power transistor 25a is a power element for switching the electricity supply to the stator coil 35. The power diode 25b is an element for absorbing surge voltage during switching of the electricity supply. The hall element 25c is a sensor for detecting the angle of rotation of rotor 43. Electronic components generating large amounts of heat are disposed the area 200 because the area 200 is cooled by the fluid inside the pump chamber (or, more precisely, inside the second indentation 20 shown in FIG. 1). The hall element 25c is disposed in this area so that it can accurately detect the magnetic pole of rotor 43. In this way, it is possible to prevent the power transistor 25a and the power diode 25b, which generate large amounts of heat, and the hall element 25c, from reaching high temperatures.

Electronic components 29 that generate smaller amounts of heat may be disposed in an area of the upper face of the board 24 away from the stator 33. Electronic components 29 generating small amounts of heat include a capacitor and a diode for absorbing surges from the power source, for example. Terminals 26 are also attached to the upper face of the board 24. The terminals 26 are connected to the connector 21 via the electric wiring 28. Three terminal lands 27 are also provided on the upper face of the board 24 (see FIG. 4).

Figure 3:
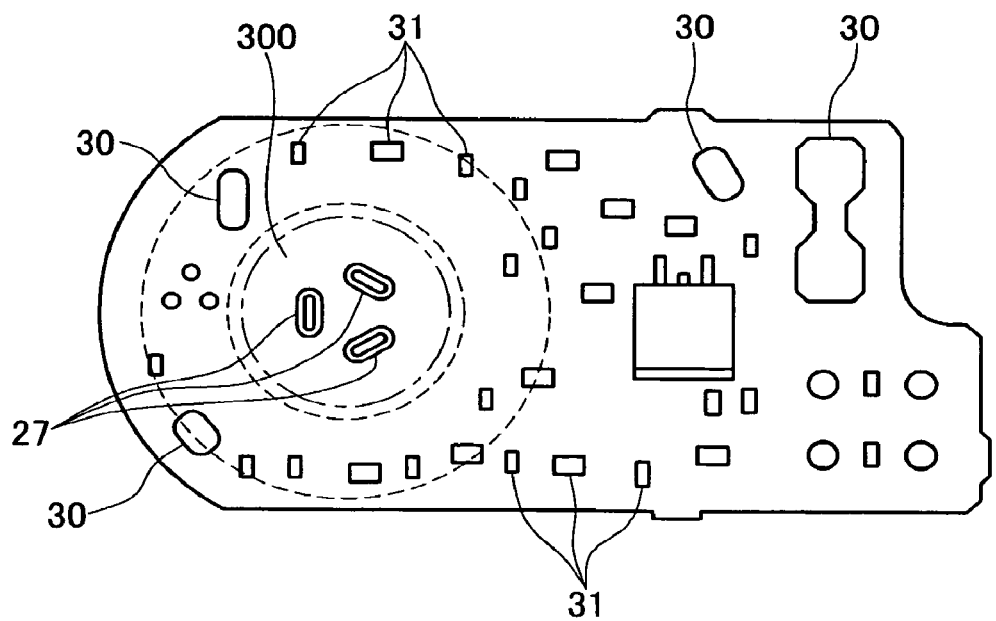
FIG. 3 is a plan view of the bottom face of the circuit board according to the first detailed representative embodiment.

As shown in FIG. 3, electronic components 31 may also be mounted on the non-stator side face of the board 24 (referred to below as the bottom face). The electronic components 31 mounted on the bottom face of the board 24 include chip transistors and chip resistors, for example. Printed wiring (not shown in the diagram) is also arranged on the bottom face of the board 24. A plurality of holes 30 passing through from the bottom face to the upper face of the board 24 are provided (see FIGS. 2 to 4).

An area 100 shown in FIG. 2 and FIG. 4 (the area enclosed by the dashed line) is a circular area including substantially the whole of the area (shadow area) formed on the upper face of the board 24 when the stator coil 35 is projected onto the board 24. An area 300 shown in FIG. 3 shows the area 100 on the upper face of the board 24 superimposed onto the bottom face of the board 24. As FIGS. 2 to 4 make clear, no electronic components are disposed inside either the area 100 on the upper face of the board 24 or the area 300 on the bottom face of the board 24. This is because heat from the stator coil 35 is easily conducted to the areas 100 and 300, which therefore reach high temperatures. Consequently, although heat produced when current flows to the stator coil 35 is conducted to the board 24 via the terminals 37 and the potting material 41, the electronic components are prevented from reaching high temperatures that might shorten their lifespan or cause them to break by not mounting those electronic components in the areas 100 and 300.

As a comparison between FIG. 2 and FIG. 3 makes clear, the electronic components 25 and 29 mounted on the upper face of the board 24 are larger than the electronic components 31 mounted on the bottom face of the board 24. More precisely, even the smallest of the electronic components 25 and 29 mounted on the upper face of the board 24 is larger than any of the electronic components 31 mounted on the bottom face of the board 24. The larger an electronic component is, the greater the distance between its electrodes. For this reason, the distance between the electrodes of each of the electronic components 25 and 29 mounted on the upper face of the board 24 is greater than that of any of the electronic components 31 mounted on the bottom face of the board 24. In other words, even the shortest distance between electrodes of any of the electronic components 25 and 29 mounted on the upper face of the board 24 is greater than the largest distance between electrodes of any of the components 31 mounted on the bottom face of the board 24.

Consequently, when the liquid-form (liquid-state) potting material 41 is poured into housing 12, air bubbles are prevented from becoming trapped in the potting material 41 on the stator side, and the number of bubbles (i.e., the amount of air) in the potting material 41 on the stator side is reduced. Because of this, any air bubbles trapped in the potting material 41 on the stator side can be removed within a short period of time.

Moreover, since the holes 30 are provided on the board 24, bubbles in the potting material 41 on the stator side can escape to the non-stator side not only through the space between housing 12 and the side face of the board 24, but also through the holes 30. Also by doing this, bubbles in the potting material 41 on the stator side can be removed within a short period of time.

Furthermore, even if some bubbles remain on the stator side of the potting material 41, the large distance between the electrodes of the electronic components 25 and 29 mounted on the stator side prevents shorting.

The small electronic components 31, meanwhile, are mounted on the bottom face of the board 24. The bottom face of the board 24 is the side on which housing 12 is left open, so that there is nothing to prevent bubbles from escaping. Bubbles caught in the non-stator side of the potting material 41 thus escape easily and can be removed within a short period of time.

Figure 5:
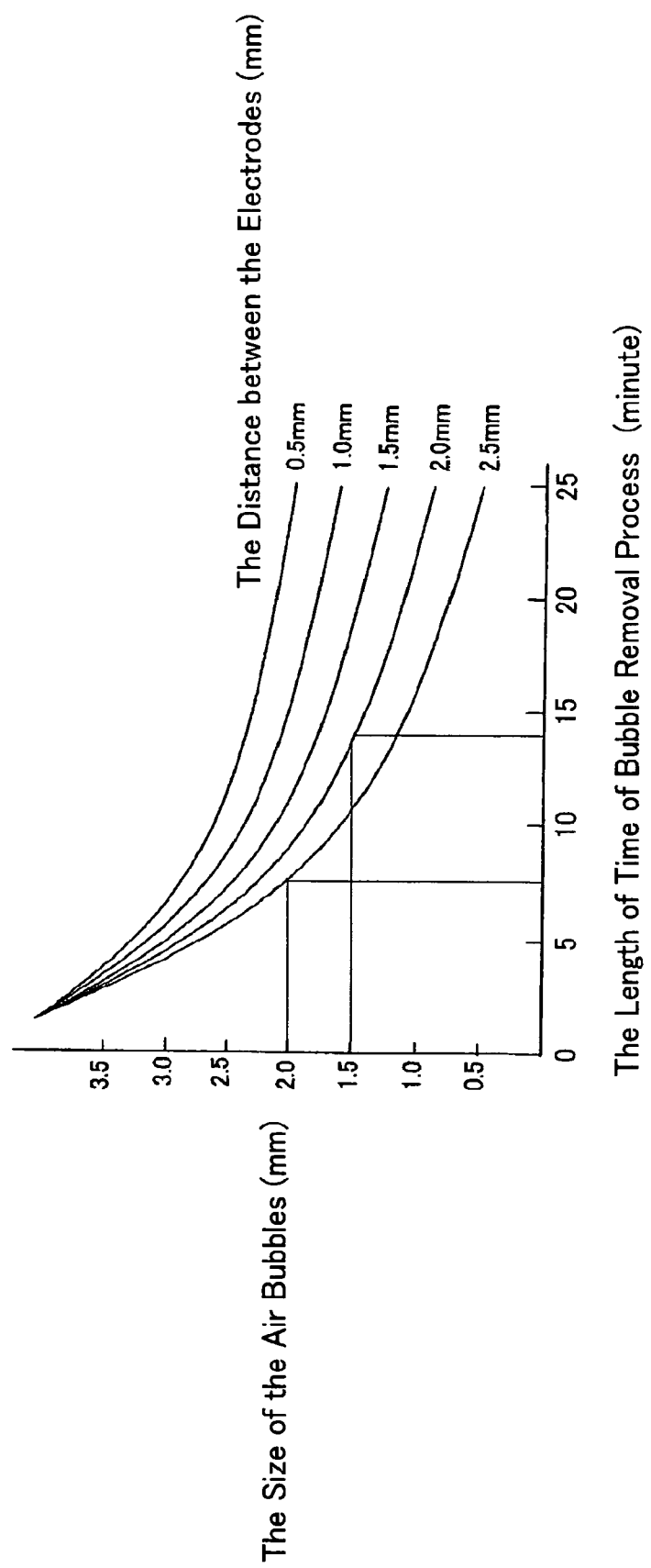
FIG. 5 is a graph showing the relationship between the distance between the electrodes of the electronic components mounted on the stator-side face of the board, the length of time spent on bubble removal, and the size of the remaining bubbles.

It is preferable that the distance between the electrodes of the electronic components mounted on the upper face of the board 24 (i.e., the stator side face of the board 24) may be at least 2.0 mm. This reduces the incidence of shorting between the electrodes, while still maintaining good productivity. FIG. 5 is a graph showing the relationship between the distance between the electrodes of the electronic components mounted on the stator-side face, the length of time spent on bubble removal, and the size of the air bubbles remaining in the periphery of the electronic components after the bubble removal process. As shown in FIG. 5, the longer the time spent on the bubble-removing process, the smaller the size of the bubbles remaining in the periphery of the electronic components. For identical bubble-removal times, the size of the remaining bubbles gets smaller, the larger the distance between the electrodes of the electronic components. This is thought to be because electronic components having a larger distance between electrodes also have a commensurately larger space between them and the board, making it more difficult for air bubbles to become trapped.

The incidence of shorting between electrodes is reduced if the size of the remaining air bubbles is smaller than the distance between the electrodes of the relevant electronic components. In other words, if air bubbles remain in the periphery of an electronic component that are larger than the distance between the electrodes of this electronic component, it is possible that an air bubble might be produced that spans the gap between the electrodes. If an air bubble is produced that spans the gap between the electrodes, shorting is caused between the electrodes by migration when the moisture inside the bubble condenses. If the bubbles remaining in the periphery of an electronic component are smaller than the distance between the electrodes of this electronic component, however, then the air bubble cannot span the gap between the electrodes. Consequently, no shorting will occur between the electrodes when the moisture in the bubble condenses.

As explained above, shorting between electrodes is prevented by reducing the bubbles remaining in the periphery of the electronic components to a size smaller than the distance between electrodes of the relevant electronic components. The size of the air bubbles remaining in the periphery of the electronic components can be controlled by the length of time spent on bubble removal. For this reason, it is desirable to make the bubble removal time sufficient so that any bubbles remaining in the periphery of the electronic components are smaller than the distance between the electrodes of the relevant electronic components. Research carried out by the inventors demonstrates that shorting between the electrodes can be effectively limited by making the size of the remaining bubbles approximately 0.5 mm smaller than the distance between the electrodes of the relevant electronic components. Consequently, in order to reduce to 2.0 mm or less the size of the bubbles remaining in the periphery of an electronic component having a distance between electrodes of 2.5 mm, a bubble removal time of 7.5 minutes is preferable, while the bubble removal time is preferably set at 14 minutes in order to reduce to a size of 1.5 mm or less the air bubbles remaining in the periphery of an electronic component having an distance between electrodes of 2.0 mm (see FIG. 5). In the case of an electronic component having a distance between electrodes of 1.5 mm, it would be necessary to carry out approximately 50 minutes of bubble removal in order to reduce the size of the remaining bubbles to 1.0 mm or less. Consequently, in order to mount an electronic component having a distance between electrodes of 1.5 mm on the stator-side face of the board, an extremely long bubble removal time would be necessary in order to prevent shorting between the electrodes, thus reducing productivity and increasing costs. Making the distance between the electrodes of the electronic components mounted on the stator side face 2.0 mm or more as described above reduces the incidence of shorting between electrodes while still maintaining good productivity.

Second Detailed Representative Embodiment

Next, an electric pump according to a second detailed representative embodiment of the present teachings will be explained. The explanation that follows omits mention of aspects overlapping with the first detailed representative embodiment described above, and only covers those aspects particular to the second detailed representative embodiment (the same applies to the description of the third detailed representative embodiment below).

Figure 6:
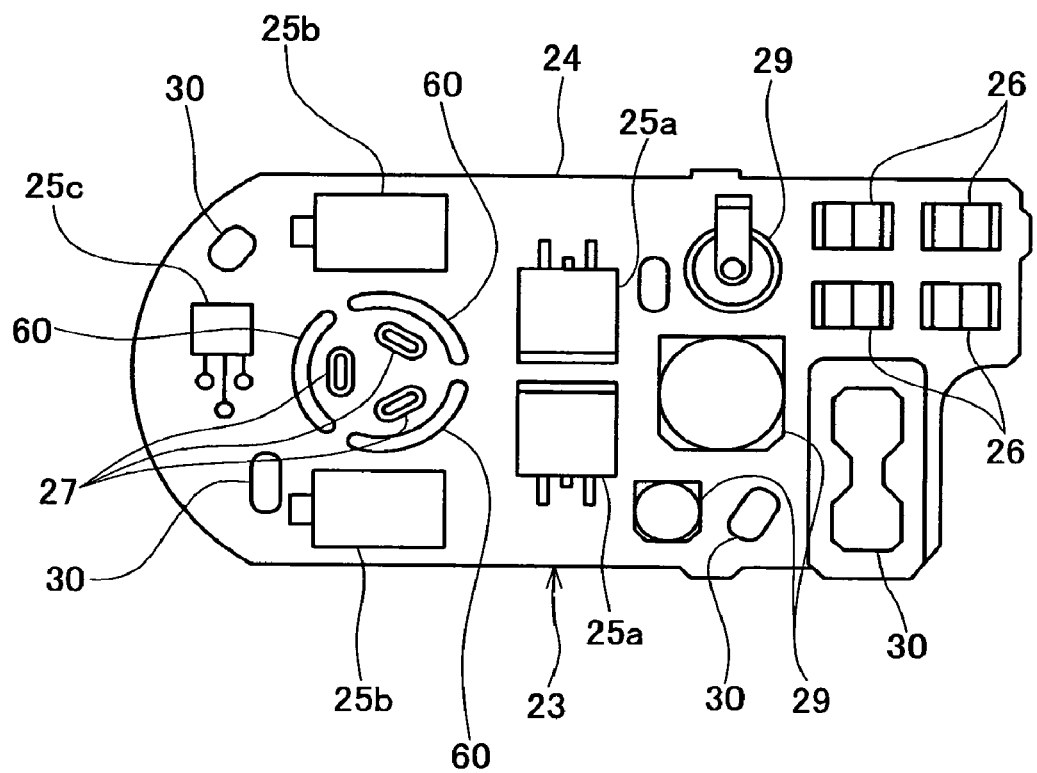
FIG. 6 is a plan view of the upper face of the circuit board according to a second detailed representative embodiment (stator not shown).

As shown in FIG. 6, three arc-shaped slits 60 are provided around the terminal lands 27 in the board 24. The electronic components 25 (25a to 25c) and 29 are mounted in an area outside the slits 60. The slits 60 may be filled with the potting material 41 that fills the first indentation 14. In this case, it is preferable that the thermal conductivity of the potting material 41 may be lower than that of the board 24. For example, the thermal conductivity of the potting material 41 may be made lower than that of the board 24 by using an epoxy- or silicon-type substance for the potting material 41 and making the board 24 from glass epoxy. If the thermal conductivity of the potting material 41 is lower than that of the board 24, then any heat conducted from the stator 33 to the board 24 via the terminals 37 is prevented from reaching the area where the electronic components 25 and 29 are mounted. This prevents the electronic components 25 and 29 from increasing in heat.

The slits 60 need not be filled with the potting material 41. For example, it is possible to mask the slits 60 with tape before pouring in the potting material, so that the inside of the slits 60 is preserved as an empty space. Making the inside of the slits 60 an empty space prevents heat conducted from the stator to the board 24 via the terminals 37 from spreading to the area where the electronic components 25 and 29 are mounted.

Third Detailed Representative Embodiment

Figure 7:
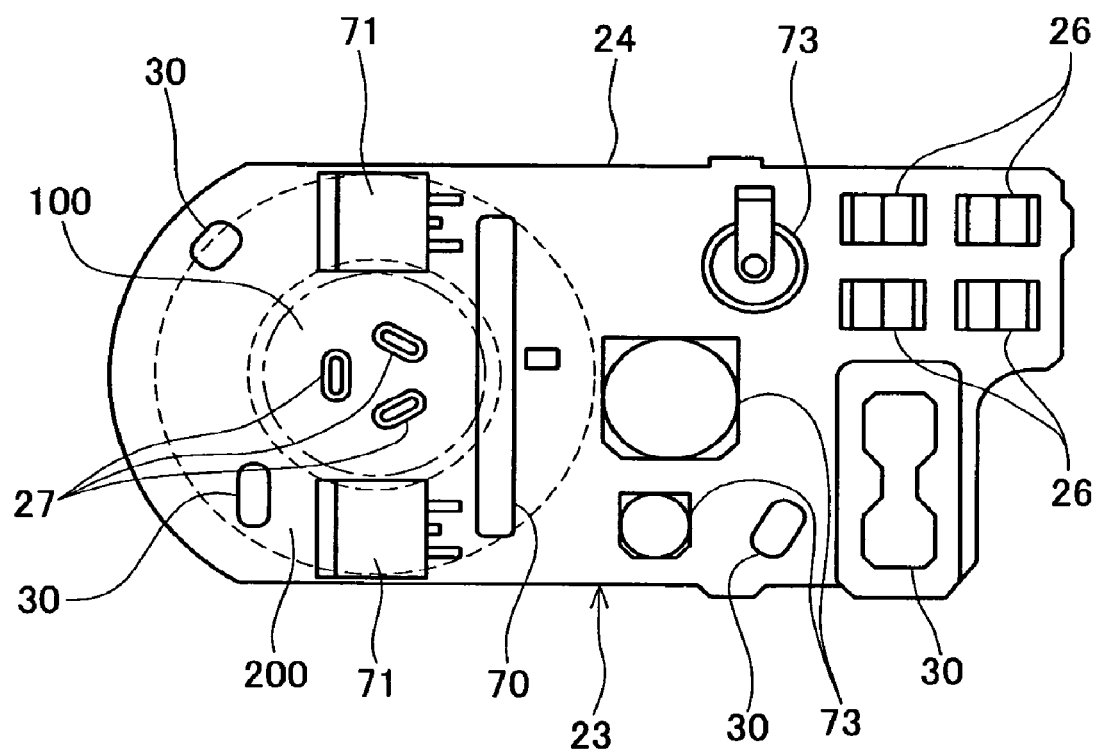
FIG. 7 is a plan view of the upper face of the circuit board according to a third detailed representative embodiment (stator not shown).

As shown in FIG. 7, a straight-lined slit 70 is formed in the board 24. The inside of the slit 70 may be filled with the potting material 41. The thermal conductivity of the potting material 41 is lower than that of the board 24. The two areas 100 and 200 shown on the diagram are the same as the area 100 and the area 200 described above for the first detailed representative embodiment (see FIGS. 2 and 4). The electronic component 71 is mounted on one side (in FIG. 7 the left side) of the board 24 divided by the slit 70. The electronic component 73 is mounted on the other side of the board 24 divided by the slit 70 (in FIG. 7, the right side).

Filling the inside of the slit 70 with the potting material 41 having lower thermal conductivity than the board 24 makes it difficult for any heat conducted from the stator 33 to the board 24 via the terminals 37 to be conducted to the other side of the board 24 (i.e., the right side of the board 24). This prevents the temperature of the electronic component 73 mounted on the other side of the board 24 from increasing. Also, the electronic component 71 mounted on one side of the board 24 is mounted in the area 200 that is cooled by the fluid inside the second indentation 20. This prevents the temperature of the electronic component 71 from increasing. As in the first detailed representative embodiment, no electronic components are mounted within the area 100 that is heated by the stator coil 35.

If a substance having greater thermal conductivity than the board 24 is used as the potting material 41, then it is preferable that the slits 27 or the slit 70 may be blocked with a substance having lower thermal conductivity than the board 24. For example, a piece matching the shape of the slits 27 or the slit 70 can be made from a substance having lower thermal conductivity than the board 24, and this piece can then be fixed (for example, by welding) into the slits 27 or the slit 70. Blocking the slits 27 or the slit 70 with a substance having smaller thermal conductivity than the board 24 reduces the amount of heat conducted across the slits 27 and 70.

The preferred representative embodiment of the present teachings have been described above, the explanation was given using, as an example, the present teachings is not limited to this type of configuration.

For example, in the detailed representative embodiments described above, only electronic components 31 having a small distance between electrodes were mounted on the bottom face (i.e., the non-stator or opening side) of the board 24, but electronic components having a large distance between electrodes may also be mounted on the bottom face of the board 24. In other words, if the electronic components mounted on the 'stator side' face of the board from which it is more difficult for bubbles to escape are of a specified size, then the size of the electronic components mounted on the 'non-stator side' of the board, from which it is easier for bubbles to escape, may be determined as desired.

Also, although an outer-rotor type pump was used in the embodiments described above, the present teachings may also be employed with an inner-rotor type pump.

Finally, although the preferred representative embodiment has been described in detail, the present embodiment is for illustrative purpose only and not restrictive. It is to be understood that various changes and modifications may be made without departing from the spirit or scope of the appended claims. In addition, the additional features and aspects disclosed herein also may be utilized singularly or in combination with the above aspects and features.

The invention claimed is:

1. An electronic control unit comprising:
a case;
a board disposed within the case; and
electronic components mounted on the board,
wherein the case is formed with an opening in one face thereof opposite one of the faces of the board and is filled with potting material, and the board and the electronic components are embedded in the potting material,
and the distance between the electrodes of the respective electronic components mounted on the non-opening side face of the board is greater than that of any of the electronic components mounted on the opening-side face of the board.

2. An electronic control unit according to claim 1, wherein a hole is provided on the board that passes through from the opening-side face to the non-opening side face.

3. An electronic control unit according to claim 2, wherein a space is formed between the board and the inner face of the wall of the case.

4. An electronic control unit according to claim 1, further comprising a stator coil electrically connected to terminals provided on the board, wherein the board has a slit that divides the mounting face thereof into a terminal-side area and a non-terminal side area, and wherein none of the electronic components is mounted on the terminal side area.

5. An electronic control unit according to claim 4, wherein the slit is formed within an area formed by projecting the stator coil onto the board from infinity at the non-board side of the stator coil, and further from the center of the projection area than the terminals, and the electronic components are mounted outside the slit.

6. An electronic control unit according to claim 5, wherein the slit is filled with resin material having lower thermal conductivity than the board.

7. An electronic control unit according to claim 1, further comprising a stator coil electrically connected to terminals provided on the board, wherein no electronic components are mounted within an area formed by projecting the stator coil onto the board from infinity at the non-board side of the stator coil.

8. An electronic control unit comprising:
a case;
a board disposed within the case; and
electronic components mounted on the board,
wherein the case is formed with an opening in one face thereof opposite one of the faces of the board, and is filled with potting material, and the board and the electronic components are embedded in the potting material,
and the distance between the electrodes of the respective electronic components mounted on the non-opening side face of the board is at least 2.0 mm.

9. An electronic control unit according to claim 8, further comprising a stator coil electrically connected to terminals provided on the board, wherein no electronic components are mounted within an area formed by projecting the stator coil onto the board from infinity at the non-board side of the stator coil.

10. An electronic control unit according to claim 9, wherein the board has a slit that divides the mounting face thereof into a terminal-side area and a non-terminal side area, and wherein none of the electronic components is mounted on the terminal side area.

11. An electronic control unit according to claim 10, wherein the terminals are provided within the projection area of the board, and the slit is formed within the projection area, and further from the center of the projection area than the terminals, and the electronic components are mounted outside the slit.

12. An electronic control unit according to claim 11, wherein the slit is filled with resin material having lower thermal conductivity than the board.

13. An electronic control unit according to claim 12, wherein a hole is provided on the board that passes through from the opening-side face to the non-opening side face.

14. An electronic control unit according to claim 13, wherein a space is formed between the board and the inner face of the wall of the case.

15. An electric pump comprising:
a first case;
a second case provided adjacent to the first case, the first case and second case forming a pump chamber;
a board disposed within the first case;
electronic components mounted on the board;
a stator coil disposed within the first case, the stator coil being electrically connected to terminals provided on the board; and
a rotor having an impeller, the rotor being disposed within the pump chamber and driven by the stator coil,
wherein the first case is formed with an opening in one face thereof opposite one of the faces of the board and is filled with potting material, and the board and the electronic components are embedded in the potting material,
and the distance between the electrodes of the respective electronic components mounted on the non-opening side face of the board is greater than that of any of the electronic components mounted on the opening-side face of the board.

16. An electric pump according to claim 15, wherein electronic components generating a large amount of heat are mounted in an area of the board opposite an accommodation portion of the rotor within the pump chamber.

17. An electric pump according to claim 16, wherein a slit is formed on the board, dividing the mounting area of the board into a terminal-side area and a non-terminal side area, and no electronic components are mounted on the terminal-side area of the board, except within an area opposite the accommodation portion of the rotor.

* * * * *